(12) United States Patent
Chung et al.

(10) Patent No.: US 6,175,462 B1
(45) Date of Patent: *Jan. 16, 2001

(54) HIGH INPUT IMPEDANCE SINGLE ENDED, LOW SUPPLY VOLTAGE MAGNETORESISTIVE PREAMPLIFIER CIRCUITS

(75) Inventors: Paul Wingshing Chung, San Jose; Stephen Alan Jove, Watsonville, both of CA (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/970,660

(22) Filed: Nov. 14, 1997

(51) Int. Cl.[7] .................................. G11B 5/03; G11B 5/02
(52) U.S. Cl. .................................... 360/67; 360/66
(58) Field of Search ............................ 360/66, 67

(56) References Cited

U.S. PATENT DOCUMENTS

| | | |
|---|---|---|
| 4,134,140 | 1/1979 | Wright et al. .................. 360/67 |
| 5,122,915 | 6/1992 | Klein et al. .................. 360/113 |
| 5,323,278 | 6/1994 | Contreras et al. .................. 360/67 |
| 5,426,542 * | 6/1995 | Smith .................. 360/66 |
| 5,436,595 | 7/1995 | Wholey et al. .................. 330/296 |
| 5,444,579 | 8/1995 | Klein et al. .................. 360/67 |
| 5,543,979 | 8/1996 | Davies .................. 360/67 |
| 5,548,453 | 8/1996 | Sasaki et al. .................. 360/67 |
| 5,559,472 | 9/1996 | Kobayashi .................. 330/293 |
| 5,619,386 | 4/1997 | Voorman et al. .................. 360/67 |
| 5,986,839 * | 11/1999 | Klaassen et al. .................. 360/66 |

* cited by examiner

*Primary Examiner*—Nabil Hindi
*Assistant Examiner*—Regina Y. Neal
(74) *Attorney, Agent, or Firm*—Noreen A. Krall; G. Marlin Knight

(57) ABSTRACT

The present invention is a preampifier circuit for magnetoresistive (MR) elements which has a high imput impedance with respect to the MR resistance so that the resultant system would not be sensitive to the series input inductance of the leads necessary to connect the MR element with the preamplifier. With former preamplifiers, nearly all are low impedance types, (using either BiCMOS or BiPolar technology), or differential (using BiPolar technology). The present invention fills a need in the prior art by providing a preamplifier curcuit using BiCMOS technology with a high input impedance, and single ended (SE) topology for minimum power dissipation.

6 Claims, 2 Drawing Sheets

HIGH INPUT IMPEDANCE SINGLE ENDED, LOW SUPPLY VOLTAGE MAGNETORESISTIVE PREAMPLIFIER CIRCUITS

BACKGROUND OF THE INVENTION

1. Field of the Invention

The present invention relates to magnetic recording disk storage systems employing a preamplifier circuit for magnetoresistive (MR) elements. More particularly, the present invention relates to an improved preamplifier circuit for MR elements which has a high impedance so that the resultant system would not be sensitive to the series input inductance of the leads necessary to connect the MR element with the preamplifier.

2. Description of Related Art

A typical magnetic disk storage system includes at least one rotatable magnetic disk which is supported on a spindle and rotated by a disk drive motor. The magnetic recording media on each disk is in the form of an annular pattern of concentric data tracks on the disk.

At least one slider is positioned on the disk, each slider supporting one or more magnetoresistive elements for reading data from and writing data to the disks. As the disks rotate, the slider is moved radially in and out over the disk surface so that heads may access different portions of the disk where desired data is recorded. Each slider is attached to a positioner arm by a suspension. The suspension provides a slight spring force which biases the slider against the disk surface. Each positioner arm is attached to an actuator assembly. The actuator assembly often includes voice coil motor (VCM). The VCM comprises a coil movable within a fixed magnetic field, the direction and speed of the coil movements being controlled by the current signals supplied by the actuator controller.

During operation of the disk drive system, the rotation of the disk generates an air bearing between the slider and the disk surface which exerts an upward force or lift on the slider. The air bearing thus counter-balances the slight spring force of the suspension and supports the slider off and slightly above the disk surface by a small, substantially constant spacing during normal operation.

The various components of the disk drive system are controlled in operation by control signals generated by a control unit. Control signals include, for example, control signals and internal clock signals. Typically, the control unit comprises logic control circuits, storage means and a microprocessor. The control unit generates control signals to control various system operations such as drive motor control signals and head position and seek control signals. The control signals provide the desired current profiles to optimally move and position the slider to the desired data track on the disk. Read and write signals are communicated to and from the read/write heads by means of a recording channel.

A need presented itself for a single ended (SE) preamplifier circuit for magnetoresistive (MR) elements which has a high input impedance with respect to the MR resistance so the resultant system would not be sensitive to the series input inductance of the leads necessary to connect the MR element with the preamplifier having low power dissipation. With former preamplifiers, all were low input impedance types, for example using BiCMOS or BiPolar technology, or differential, using BiPolar technology. The need became apparent to use a BiCMOS technology with a high input impedance, SE amplifier.

U.S. Pat. No. 5,323,278 (issued to Contreras et al.) was presented to solve the need for such a preamplifier which could work with very low supply voltages, for example, 3 volts. However, the circuit disclosed used a current bias for the MR element, and contained other limitations on noise performance, and offset performance. Other circuits found in the art include U.S. Pat. No. 5,548,453 which teaches a base-grounded amplifier with a single ended MR device; U.S. Pat. No. 5,444,579 which teaches a preamplifier that uses a current-mode amplifier; U.S. Pat. No. 5,619,386 which teaches a single ended MR element with a fast settling read amplifier; U.S. Pat. No. 5,122,915 teaches a low noise preamplifier for a single ended MR element; and U.S. Pat. No. 5,5443,979 teaches a preamplifier for common current flow in a transducer.

It is readily apparent that none of these references address the need for a high input impedance, single ended, low supply voltage MR pre-amplifier with dR/R response. Therefore, it can be seen that there is a need for a preamplifier circuit which requires low noise, low power supply operation, and dR/R response.

SUMMARY OF THE INVENTION

It is the object of the invention to provide a high input impedance, single ended (SE) preamplifier for an MR element capable of very low supply voltages and having low noise.

According to these objects, the present invention is a preampifier circuit for magnetoresistive (MR) elements which has a high imput impedance with respect to the MR resistance so that the resultant system would not be sensitive to the series input inductance of the leads necessary to connect the MR element with the preamplifier. With former preamplifiers, nearly all are low impedance types, (using either BiCMOS or BiPolar technology), or differential (using BiPolar technology). The present invention fills the need in the prior art by providing an SE preamplifier circuit using BiCMOS technology with a high input impedance.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 1 is a simplified perspective drawing of a magnetic recording disk drive system that the preamplifier circuit of the present invention could be used in;

DETAILED DESCRIPTION OF THE PREFERRED EMBODIMENT

This invention is described in a preferred embodiment in the following description with reference to the figures, in which like numbers represent the same or similar elements. While this invention is described in terms of the best mode for achieving this invention's objectives, it will be appreciated by those skilled in the art that variations may be accomplished in view of these teachings without deviating from the spirit or scope of the invention.

Figure 1:
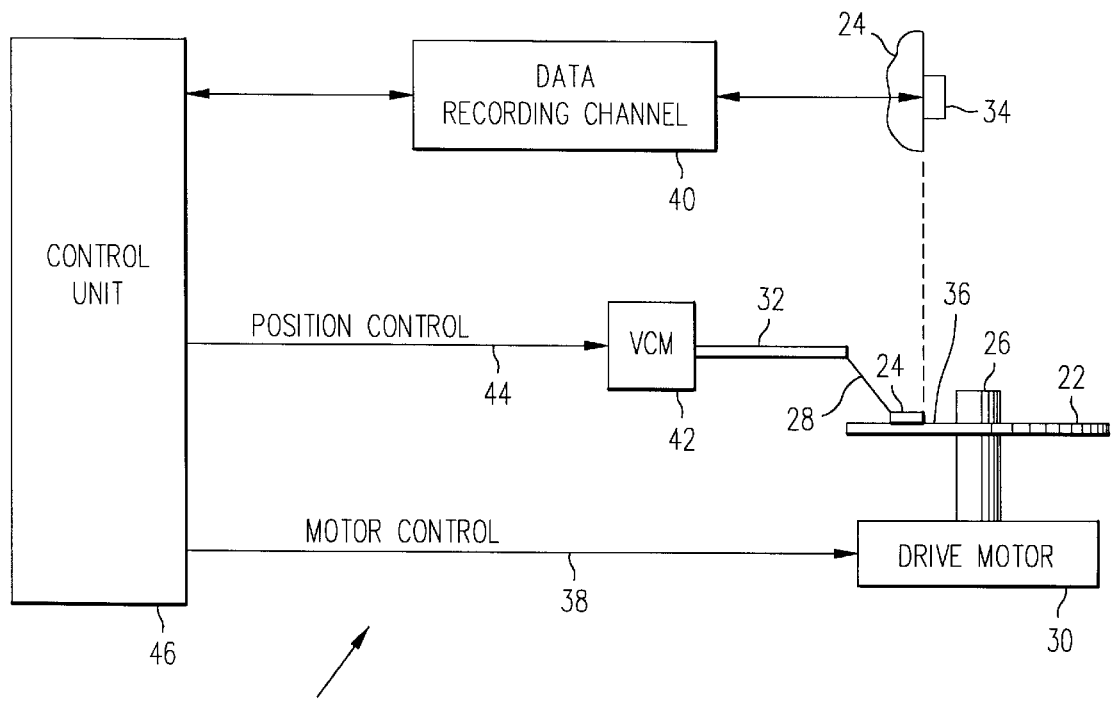

FIG. 1, shows a simplified perspective view of a disk drive 20 embodying the present invention. As shown in FIG. 1, at least one rotatable magnetic disk 22 is supported on a spindle 26 and rotated by a disk drive motor 30. The magnetic recording media on each disk is in the form of an annular pattern of concentric data tracks (not shown) on disk 22.

Figure 2:
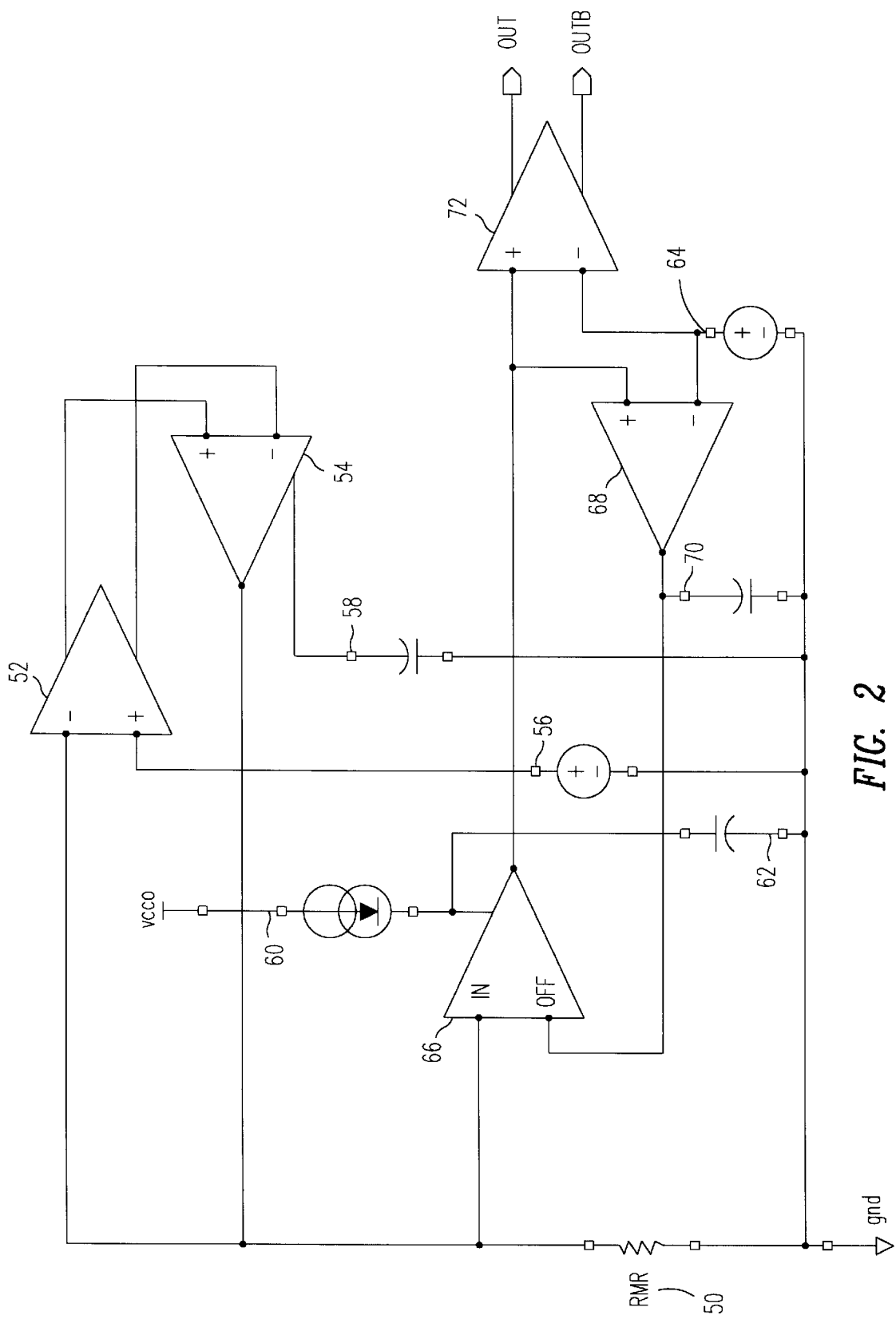
FIG. 2 is a block diagram of a preamplifier in accordance with the present invention.

At least one slider 24 is positioned on the disk 22, each slider 24 supporting one or more magnetic read/write heads 34. As the disks rotate, slider 24 is move radially in and out over disk surface 36 so that heads 34 may access different portions of the disk where desired data is recorded. Each slider 24 is attached to an actuator arm 32 by means of a suspension 28. The suspension 28 provides a slight spring force which biases slider 24 against the disk surface 36. Each actuator arm 32 is attached to an actuator means 42. The actuator means as shown in FIG. 2 may be a voice coil motor (VCM). The VCM comprises a coil movable within a fixed magnetic field, the direction and speed of the coil movements being controlled by the motor current signals supplied by controller 46.

During operation of the disk drive storage system, the rotation of disk 22 generates an air bearing between slider 24 and disk surface 36 which exerts an upward force or lift on the slider. The air bearing thus counter-balances the slight spring force of suspension 28 and supports slider 24 off and slightly above the disk surface by a small, substantially constant spacing during normal operation.

The various components of the disk storage system are controlled in operation by control signals generated by control unit 46, such as access control and internal clock signals. Typically, control unit 46 comprises logic control circuits, storage means and a microprocessor. The control unit 46 generates control signals to control various system operations such as drive motor control signals on line 38 and head position and seek control signals on line 44. The control signals on line 44 provide the desired current profiles to optimally move and position slider 24 to the desired data track on disk 22. Read and write signals are communicated to and from read/write heads 34 by means of recording channel 40.

The above description of a typical magnetic disk storage system, and the accompanying illustration of FIG. 1 is for representation purposes only. It should be apparent that disk drive storage systems may contain a large number of disks and actuators, and each actuator may support a number of sliders.

Reference is now made to FIG. 2, which shows a block diagram of a preamplifier in accordance with the present invention.

MR element RMR 50 is biased into operation by a first feedback loop comprising differential amplifier 52 and transconductance amplifier 54. Differential amplifier 52 amplifies the difference between the (DC) voltage imposed across said MR element 50 and a bias reference 56. The bias reference is set to a desired MR element 50 bias voltage level. This difference is then converted into a current by transconductance amplifier 54 and fed into the positive terminal of the MR element 50. The negative terminal of said MR element 50 connects to ground for protection against electostatic and conductive asperity events. Bias capacitor 58 stabilizes the first feedback loop creating a first low frequency pole in the system.

Figure 3:
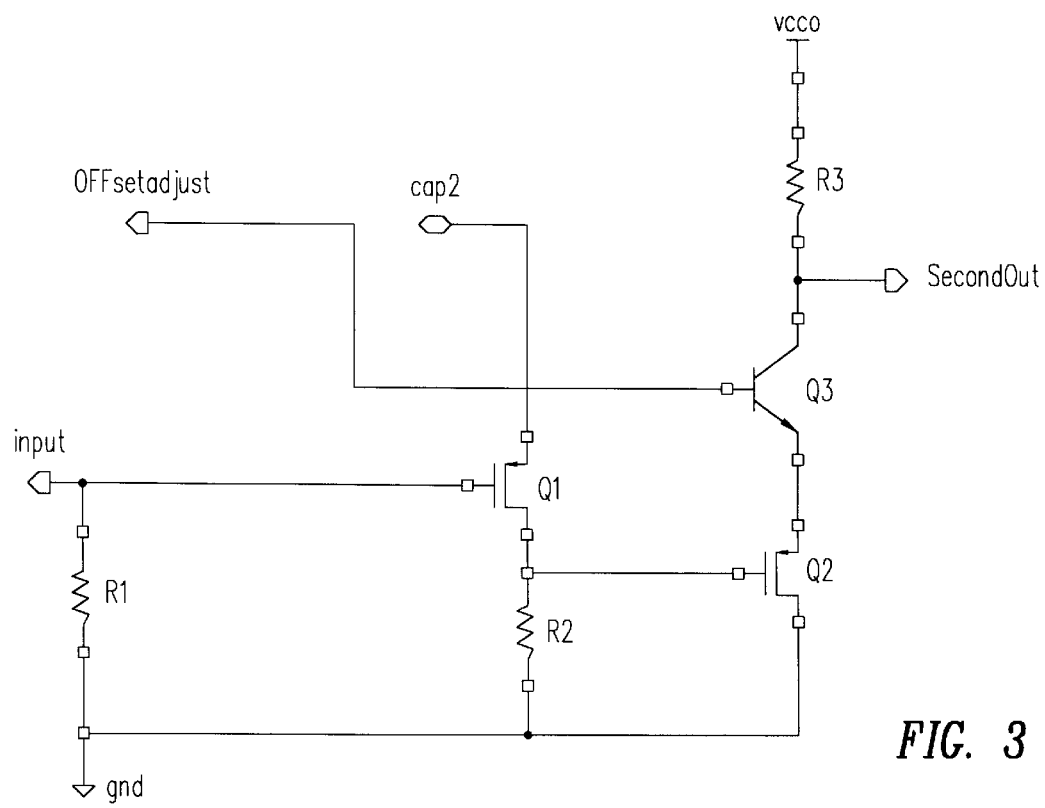
FIG. 3 is a detailed circuit diagram of the gain stage of the preamplifier shown in FIG. 2.

The signal generated from the MR element 50 while reading data from some media (such as a disk 22) is first amplified by gain stage 66, the details of which are shown and described in FIG. 3. Terminating resistor R1 serves to electrically terminate the cable from said MR element 50 at the preamplifier. Input device Q1 (PFET) amplifies the signal in a common-source configuration, where current source 60 shown on FIG. 2 serves to bias said input device into the proper operating point at the source for optimal noise figure. The source of the input device is de-coupled to ground by means of capacitor 62 shown in FIG. 2. Capacitor 62, along with the parallel impedance generated from said operating point, creates a second low frequency pole in the system. A first amplified signal then exists at gain resistor R2 (shown in FIG. 3) which is then re-directed by transistor Q2 (PFET) toward cascade transistor Q3 (NPN). A second amplified signal is then seen at final gain resistor R3 as an interim single-ended signal. The operating point of the branch of said first gain stage comprising R3, Q3 and Q2 is adjusted by the base of Q3, which is further controlled by a second feedback loop to maintain a predetermined voltage 64 at the collector of Q3. This operating point is a strong contributor for overall noise performance due to the relatively low gain which can be achieved by the branch of the first gain stage comprising Q1 and R2. In other words, the noise figure for the system is strongly dependent upon the first two gain stages rather that the first gain stage as in more conventional preamplifier circuits.

The second feedback loop comprises gain stage 66 in the forward direction (described earlier) and a second transconductance stage 68 in the reverse direction. The second feedback loop is stabilized by capacitor 70. The second transconductance stage amplifies the voltage difference between predetermined voltage 64 and the interim single-ended signal, thereby minimizing the difference and producing a quasi-differential signal between R3 and the predetermined voltage 10. Capacitor 70 serves to stabilize the second feedback loop and creates a third low frequency pole into the system.

Final gain stage 72 produces a differential signal output from said quasi-differential signal, and comprises one or more standard differential amplifier stages. These stages serve to bring the signal from said MR element to a useable level for subsequent signal processing, such as in a magnetic recording disk drive system.

While the invention has been described in terms of a single preferred embodiment with optimal features, those skilled in the art will recognize that the invention can be practiced with modifications within the spirit and scope of the appended claims.

What is claimed is:

1. A preamplifier circuit for a magnetoresistive (MR) element in a disk storage system comprising:

a biasing circuit for providing bias to said MR element which comprises a voltage bias feedback loop which senses a differential between DC voltage across the MR element and a reference voltage and the voltage bias feedback loop further comprising an amplifier which amplifies the differential and a transconductance amplifier which feeds current into the MR element in response to the amplifier;

an offset control feedback loop independent of the biasing circuit; and a single-ended, high input impedance amplifying circuit connected to the MR element in parallel with the biasing circuit and which provides an output signal to said offset control feedback loop which provides an offset control input signal to the amplifying circuit which is independent of the baising circuit.

2. The preamplifer circuit as set forth in claim 1, wherein the voltage bias feedback loop is further comprised of:

a reference voltage; and a compensation capacitor.

3. The preamplifer circuit as set forth in claim 2, wherein the offset control feedback loop is further comprised of a second transconductance amplifier which uses an output signal from the amplifying circuit and a reference voltage to generate an input feedback signal for the amplifying circuit.

4. The preamplifer circuit as set forth in claim 3, wherein the amplifying circuit is further comprised of a low noise input device;

a first gain resistor; and a level-shifting amplifier stage having a single ended output.

5. The preamplifier circuit as set forth in claim 4, wherein the amplifying circuit further comprises means for adjusting a dc component of said single sided output.

6. The preamplifier circuit as set forth in claim 4, wherein the level shifting amplifier stage is further comprised of a level shifting device;

an amplifying device; and a second gain resistor.

* * * * *